United States Patent [19]
Lau et al.

[11] Patent Number: 5,266,529
[45] Date of Patent: Nov. 30, 1993

[54] FOCUSED ION BEAM FOR THIN FILM RESISTOR TRIM ON ALUMINUM NITRIDE SUBSTRATES

[75] Inventors: James C. Lau, Torrance; Maurice Lowery, Los Angeles; Kenneth Lui, Fountain Valley, all of Calif.

[73] Assignee: TRW Inc., Redondo Beach, Calif.

[21] Appl. No.: 780,175

[22] Filed: Oct. 21, 1991

[51] Int. Cl.$^5$ .................................. H01L 21/465
[52] U.S. Cl. .................................. 437/228; 437/192; 437/918; 437/173; 257/537
[58] Field of Search .................. 437/918, 20, 228, 47; 156/626, 345; 148/DIG. 83, DIG. 136; 257/537, 904, 359

[56] References Cited
U.S. PATENT DOCUMENTS

| | | | |
|---|---|---|---|
| 4,457,803 | 7/1984 | Takigawa | 156/626 |
| 4,737,757 | 4/1988 | Senda et al. | 338/308 |

FOREIGN PATENT DOCUMENTS

| | | | |
|---|---|---|---|
| 58-210653 | 12/1983 | Japan | 437/918 |
| 62-232953 | 10/1987 | Japan | 437/918 |
| 63-102347 | 5/1988 | Japan | 437/918 |

OTHER PUBLICATIONS

Fabrication of Microelement Resistors by Electron Beam and their Characteristics By Kimura et al., 1965, 1st Ent. Conf. on electron and Ion Beam Science and techno.

Miro-Machining by Ion Bombardment by Castaing et al. 1966, vol. 2, Electron and Ion beam Science and Techno.

*Primary Examiner*—Olik Chaudhuri
*Assistant Examiner*—H. Jey Tsai
*Attorney, Agent, or Firm*—Ronald L. Taylor

[57] ABSTRACT

A method for trimming thin film resistors. A focused inert ion beam is employed to selectively remove portions of a resistive film deposited on a substrate.

8 Claims, 1 Drawing Sheet

FOCUSED ION BEAM FOR THIN FILM RESISTOR TRIM ON ALUMINUM NITRIDE SUBSTRATES

BACKGROUND OF THE INVENTION

1. Technical Field

This invention relates generally to thin film resistors on aluminum nitride substrates and, more particularly, to a method for trimming the thin film resistors.

2. Discussion

Thin film resistors are used extensively in integrated circuits having resistors which require very precise resistance values. By controlling the deposition of a thin film of resistive material on an insulating substrate, the resistivity of the film as well as the resulting resistance can be controlled to within five percent of a target resistance. For circuits requiring even more precise resistances, laser trimming is the established method for providing fine adjustments to the resistance of the thin film resistor. By using a laser beam to etch away a predetermined pattern, or "trim kerf", of the resistive material from the substrate, the available conductive path is reduced and the resistance is, therefore, increased. Active trimming processes in which actual circuit performance is monitored as the result of trim can be used to adjust resistance to within one tenth of one percent. Precision of the trim monitoring equipment normally becomes the limiting factor in resistance accuracy.

When an aluminum nitride substrate is used, however, unpredictable results have been obtained from the laser trimming process. Decreases in resistance after laser trimming have been found to occur, possibly as a consequence of the transformation of the aluminum nitride into highly conductive aluminum metal. An improved method for providing fine adjustments to the thin film resistor formed on an aluminum nitride substrate is, therefore, required.

SUMMARY OF INVENTION

The present invention employs a focused inert ion beam to selectively remove portions of the resistive film from the substrate in forming a thin film resistor. The ion beam can be focused more precisely than a laser, thereby providing even more precision in resulting resistance values. Also, trimming thin film resistors formed on aluminum nitride substrates with a focused ion beam does not result in the formation of aluminum metal and provides predictable results.

DETAILED DESCRIPTION OF THE INVENTION

Figure 1:
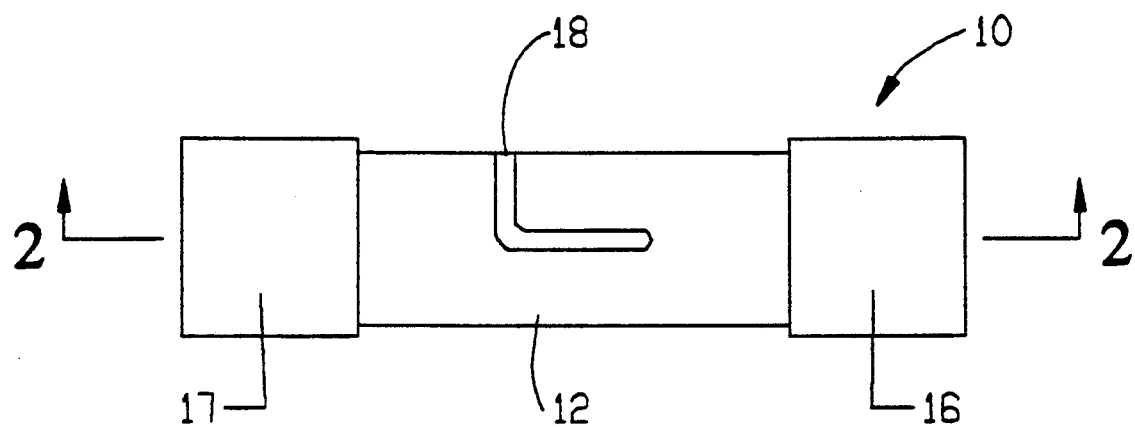
FIG. 1 is a plan view of a thin film resistor made in accordance with the teachings of the present invention.
Figure 2:
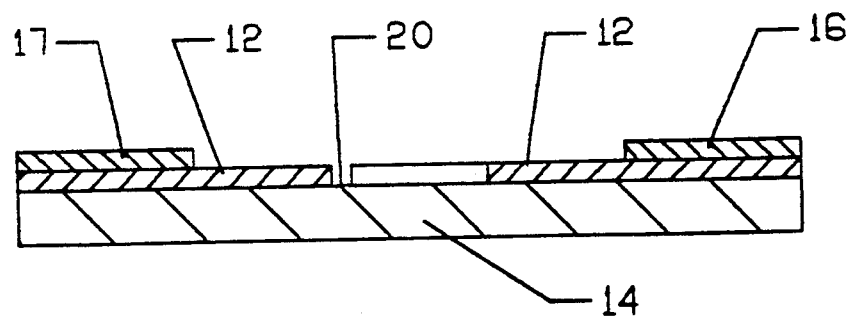
FIG. 2 is a cross sectional view taken generally through line 2—2 of FIG. 1.

Referring now to the drawings, a thin film resistor made in accordance with the method of the present invention is shown generally at 10 and includes a thin film of resistive material 12 deposited on an insulating substrate material 14. The thin film 12, preferably tantalum nitride, nickel chromium (nichrome), cermet, or other such material, has a thickness of about 300 angstroms and is formed on substrate 14 by vacuum deposition, sputtering, or other such process as is known in the art. Substrate 14 may be aluminum nitride or any other similar insulating material, the method of the present invention being particularly suited for thin film resistors formed on aluminum nitride substrates. Conductor pads 16 and 17 are deposited on the thin film 12, spaced from one another and spaced from substrate 14 by the film 12. Conductor pads 16 and 17 enable electrical coupling of the resistor 10 to an integrated circuit.

A focused ion beam is employed to selectively etch away or remove portions of the thin film 12 to form an appropriate trim kerf 18, thereby exposing a corresponding area 20 of the substrate 14. This results in reducing the available conductive path between conductor pads 16 and 17 and, therefore, in increasing the resistance of the resistor 10. The ion beam, which generates less heat than a laser beam, does not cause the aluminum nitride substrate to be transformed into aluminum metal.

The ion beam is preferably Argon, having a diameter of 500 to 10,000 angstroms. Utilizing a material having fairly low resistivity, such as tantalum nitride or nichrome, for the thin film requires greater resistor surface area but provides a more accurate trimming process. In resistors made in accordance with the teachings of this invention, resistances within a very small percent of a target resistance would be obtained.

While the invention has been described in connection with the presently preferred embodiments, one skilled in the art will readily recognize that various modifications can be made thereto without departing from the spirit and scope of the invention as set forth in the appended claims.

We claim:

1. A method of fabricating a thin film resistor with a precise resistance value comprising the steps of:
   forming a thin film of resistive material on an aluminum nitride substrate;
   attaching a pair of conductor pads directly to said thin film, said conductor pads being spaced from one another and from said substrate, said conductor pads being adaptable to electrically couple said resistive material to a circuit; and
   selectively removing portions of said thin film of resistive material with a exposing a corresponding area of said substrate.

2. The method of claim 1 wherein said ion beam is an inert beam.

3. The method of claim 1 wherein said ion beam is an Argon beam.

4. The method of claim 1 wherein said thin film of resistive material is nickel chromium (nichrome) or tantalum nitride.

5. The method of claim 1 wherein an L-shaped portion is removed from said thin film.

6. The method of claim 5 wherein said L-shaped portion abuts an edge of said resistor.

7. The method of claim 1 wherein said beam is approximately 500 to 10,000 angstroms in diameter.

8. A method of fabricating a thin film resistor with a precise resistance value comprising the steps of:
   forming a thin film of nickel chromium (nichrome) on an aluminum nitride substrate, said substrate having an edge;
   attaching a pair of conductor pads directly to said thin film, said pads being spaced from one another and from said substrate, said pads adapted to electrically couple said nickel chromium to a circuit; and
   removing an L-shaped portion of said film of nickel chromium with a focused ion beam to increase the total resistance of said resistor by exposing a corresponding area of said substrate, said L-shaped portion extending from said substrate edge.

* * * * *